United States Patent
Shiung

(10) Patent No.: US 7,269,228 B2
(45) Date of Patent: Sep. 11, 2007

(54) NON-COHERENT FREQUENCY SHIFT KEYING TRANSMITTER USING A DIGITAL INTERPOLATION SYNTHESIZER

(75) Inventor: David Shiung, Tainan (TW)

(73) Assignee: Novatek Microelectronics Corp., Hsinchu (TW)

( * ) Notice: Subject to any disclaimer, the term of this patent is extended or adjusted under 35 U.S.C. 154(b) by 779 days.

(21) Appl. No.: 10/605,399

(22) Filed: Sep. 29, 2003

(65) Prior Publication Data

US 2005/0047523 A1    Mar. 3, 2005

(30) Foreign Application Priority Data

Sep. 2, 2003    (TW) .............................. 92124167 A

(51) Int. Cl.
*H04L 27/10* (2006.01)
(52) U.S. Cl. ...................................... 375/272; 375/303
(58) Field of Classification Search ........ 375/271–272, 375/278, 295–297, 302–303, 307; 332/100
See application file for complete search history.

(56) References Cited

U.S. PATENT DOCUMENTS

| | | | | |
|---|---|---|---|---|
| 5,596,609 A | * | 1/1997 | Genrich et al. ............. | 375/350 |
| 5,633,893 A | * | 5/1997 | Lampe et al. ............... | 375/297 |
| 5,834,985 A | * | 11/1998 | Sundegrd .................... | 332/100 |
| 6,259,747 B1 | * | 7/2001 | Gustafsson et al. ......... | 375/298 |
| 6,268,818 B1 | * | 7/2001 | Xin et al. .................... | 341/152 |
| 6,392,499 B1 | * | 5/2002 | Sato ........................... | 332/100 |
| 7,103,113 B2 | * | 9/2006 | Darabi ....................... | 375/303 |
| 7,167,528 B2 | * | 1/2007 | Chen et al. ................. | 375/302 |

\* cited by examiner

*Primary Examiner*—Khanh Tran
(74) *Attorney, Agent, or Firm*—Jianq Chyun IP Office

(57) ABSTRACT

A non-coherent frequency shift keying transmitter for up-converting a baseband signal to a radio frequency signal is provided. The non-coherent frequency shift keying transmitter applies the interpolation method in a digital frequency synthesizer to replace the conventional Phase Locked Loop (PLL) circuit. The micro processing unit receives a baseband signal firstly, then the baseband signal is converted to a RF signal via a digital synthesizer, a numerical controlled oscillator, a cascaded integrator-comb filter, and a digital-analog converter. The RF signal is then transmitted via a local oscillator, a band-pass filter, a power amplifier, and a transmitting end. This circuit eliminates unnecessary analog devices so that fabrication migration issue is avoided. Further, the modulated RF signal is more stable than that of the conventional modulator, and has a more efficient spectrum control and a better performance on the receiver end. A non-coherent FSK transmitting system is also provided in the present invention.

24 Claims, 2 Drawing Sheets

NON-COHERENT FREQUENCY SHIFT KEYING TRANSMITTER USING A DIGITAL INTERPOLATION SYNTHESIZER

CROSS REFERENCE TO RELATED APPLICATIONS

This application claims the priority benefit of Taiwan application serial no. 92124167, filed Sep. 2, 2003.

BACKGROUND OF INVENTION

1. Field of the Invention

This invention generally relates to a non-coherent frequency shift keying transmitter, and more particularly to a non-coherent frequency shift keying transmitter using a digital interpolation synthesizer.

2. Description of Related Art

Digital wireless communication system, such as mobile phone communication system using bluetooth protocol, has been widely used by the consumers and becomes an indispensable tool for a modern daily life. In a digital wireless communication system, because of the high efficiency requirement for transmission, the non-coherent frequency shift keying (FSK) technology plays an important role in generating RF signals for carrying the transmitting signals.

In a digital wireless communication system, a non-coherent FSK modulator includes a micro processing unit (MPU) and a phase locked loop (PLL). The non-coherent FSK modulator converts the signals from the baseband frequency to radio frequency (RF). FIG. 1 is a block diagram of a conventional non-coherent FSK modulator 100. Referring to FIG. 1, the MPU 102 receives the source signal; the source signal is up-converted by the PLL (104, 106, and 108), processed by the power amplifier, and then transmitted. The PLL includes a phase frequency detector 104, a loop filter 106, and a voltage controlled oscillator (VCO) 108 as shown in FIG. 1.

However, the conventional non-coherent FSK modulator has the following disadvantages. First, the PLL requires a relatively long period for settling time to transmit a precise frequency and thus it is power consuming. Further, the quality of the signal transmitted by the modulator is neither satisfying. An analog circuit designer has to trade off between signal stability and short lock time, yet usually neither condition is met. Further, the modulator suffers from fabrication migration thus transmission quality is degraded for limitation of PLL bandwidth.

SUMMARY OF INVENTION

An object of the present invention is to avoid unnecessary analog circuits and use succinct analog circuits to implement the PLL in the transmitter.

Another object the present invention is to provide a non-coherent frequency shift keying transmitter using a digital interpolation synthesizer.

Still another object the present invention is to provide anon-coherent frequency shift keying transmitting system using a digital interpolation synthesizer.

The present invention provides a non-coherent frequency shift keying transmitter. A micro processing unit receives the baseband signal and generates a digital signal sequence corresponding to the baseband signal. A frequency synthesizer, coupled to the micro processing unit, synthesizes the digital signal sequence to a plurality of synthesized signals such as a 104 kHz intermediate frequency signal and a 96 kHz intermediate frequency signal.

The frequency synthesizer is a digital frequency synthesizer applying the interpolation. The digital frequency synthesizer stores a sequence having two frequencies and applies interpolation to synthesize a frequency between these two frequencies. Further, the frequency synthesizer can also be used as a frequency hopping mechanism with a numerical controlled oscillator to up-convert the signal to a higher frequency such as 2 MHz. The cascaded integrator comb filter then removes the noise. Then the digital signal sequences are converted to analog signals. The local oscillator is used to generate a RF signal. Then a band-pass filter removes the noise. Finally, the modulated RF signal is amplified and transmitted.

In the present invention, a digital frequency synthesizer is used to replace a portion of analog circuits. Hence, the fabrication migration would be reduced during the fabrication of the circuits. Further, the modulated RF signal is more stable than that of the conventional modulator, has a more efficient spectrum control, and has a better performance for the receiver.

In addition, the present invention uses digital interpolation synthesizer. Compared to the transmitting signal generated by a conventional analog PLL, the transmitting signal of the present invention is more stable; i.e., within the same frequency band of the spectrum, the utilization rate of the spectrum is much higher. Further, the performance on the receiver side is much better.

The above is a brief description of some deficiencies in the prior art and advantages of the present invention. Other features, advantages and embodiments of the invention will be apparent to those skilled in the art from the following description, accompanying drawings and appended claims.

DETAILED DESCRIPTION

Figure 1:
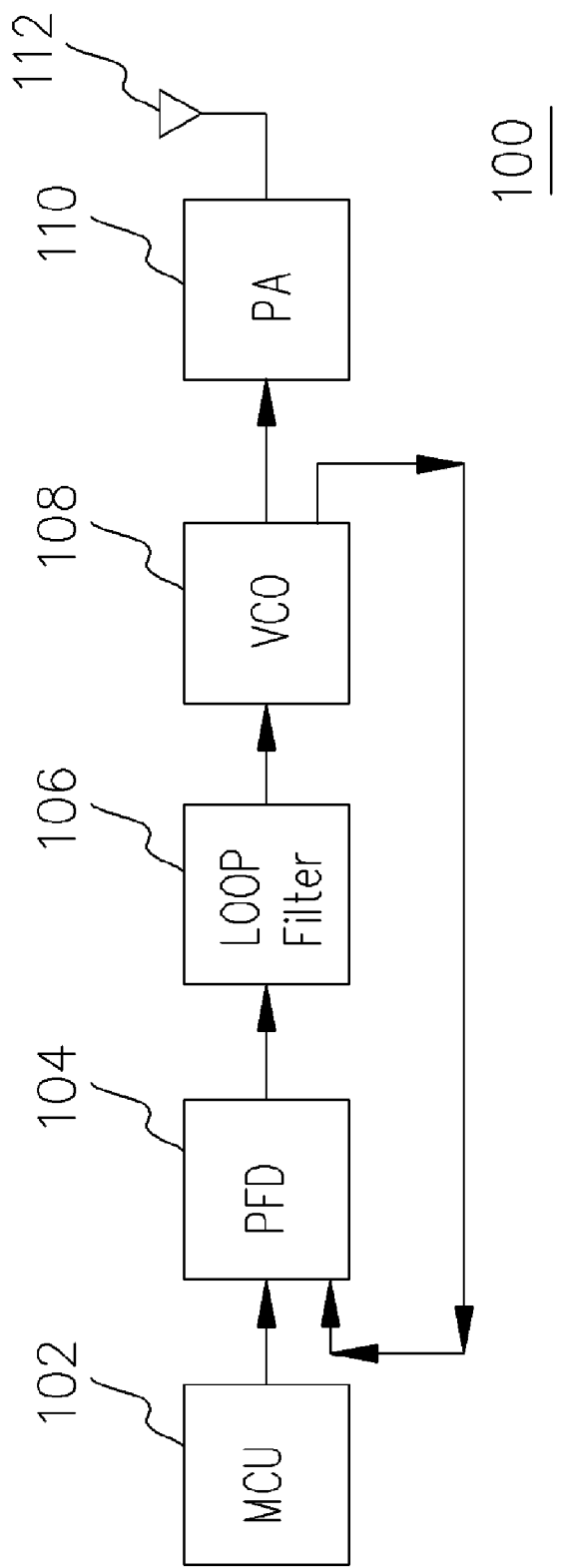
FIG. 1 is a block diagram illustrating a conventional non-coherent FSK modulator.
Figure 2:
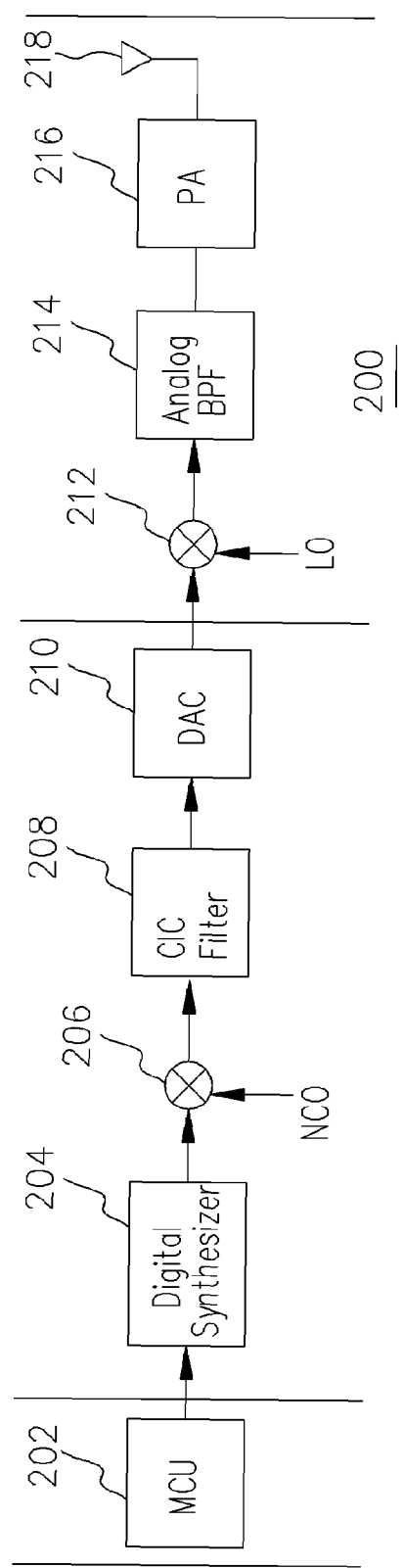
FIG. 2 is a block diagram illustrating a non-coherent FSK modulator in accordance with a preferred embodiment of the present invention.

FIG. 2 is a block diagram of a non-coherent FSK modulator 200 in accordance with a preferred embodiment of the present invention. The non-coherent FSK modulator 200 includes a micro processing unit 202, a digital synthesizer 204, a numerical controlled oscillator (NCO) 206, a cascaded integrator-comb (CIC) filter 208, a digital-analog (D/A) converter 210, a local oscillator 212, a band-pass filter 214, a power amplifier 216, and a transmitting end 218. The digital synthesizer 204, the numerical controlled oscillator (NCO) 206, the cascaded integrator-comb (CIC) filter 208, and the digital-analog (D/A) converter 210 are deemed to be an intermediate frequency processor. The local oscillator 212, the band-pass filter 214, the power amplifier 216, and the transmitting end 218 are deemed to be a radio frequency processor. The micro processing unit 202 receives the baseband signal and generates a digital signal sequence corresponding to the baseband signal inputting to the intermediate frequency processor. The digital synthesizer 204 synthesizes the digital signal sequence to two synthesized signals such as a 104 kHz intermediate frequency signal and a 96 kHz intermediate frequency signal. The numerical controlled oscillator up-converts these two signals to a higher frequency such as 2 MHz. The cascaded integrator-comb filter 208 then removes the noise. Then the digital signal sequences are converted to analog signals by the D/A converter 210. Hence, before the signals enter the D/A converter 210, the present invention provides a digital structure to replace the conventional PLL circuit.

Referring to FIG. 2, the local oscillator 212 up-converts the analog signal to a modulated RF signal. Then a bandpass filter 214 removes the noise. Finally, the modulated RF signal is amplified by the power amplifier 216 and transmitted through the transmitting end 218.

The present invention also provides a method for transmitting a non-coherent frequency shift keying, for up-converting a baseband signal to a radio frequency signal. The method comprises: receiving said baseband signal and generating a digital signal sequence corresponding to said baseband signal; synthesizing said digital signal sequence to a plurality of synthesized signals; up-converting said plurality of synthesized signals to an intermediate frequency signal with a first oscillating method; removing a noise of said intermediate frequency signal with a first filtering method; converting said noise-removed intermediate frequency signal to an analog signal; up-converting said analog signal to a radio frequency signal with a second oscillating method; and removing a noise of said radio frequency signal with a second filtering method; and amplifying said noise-removed radio frequency signal and transmitting said amplified radio frequency signal.

The step of synthesizing said digital signal sequence to a plurality of synthesized signals is performed by a digital frequency synthesis method. The first oscillating method is a numerical controlled oscillating method. The first filtering is a cascaded integrator-comb filtering method. The second oscillating method is a local filtering method. The second filtering method is an analog band-pass filtering method.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

The invention claimed is:

1. A non-coherent frequency shift keying transmitting circuit for up-converting a baseband signal to a radio frequency signal, comprising:
    a micro processing unit, for receiving said baseband signal and generating a digital signal sequence corresponding to said baseband signal;
    a frequency synthesizer using interpolation and a linear feedback shift register, coupled to said micro processing unit, for synthesizing said digital signal sequence to a plurality of synthesized signals;
    a first oscillator, coupled to said frequency synthesizer, for up-converting said plurality or synthesized signals to an intermediate frequency signal;
    a first filter, coupled to said first oscillator, for removing a noise of said intermediate frequency signal;
    a digital-analog converter coupled to said first filter;
    a second oscillator, coupled to said digital-analog converter, for up-converting to the radio frequency signal;
    a second filter, coupled to said second oscillator, for removing a noise of said radio frequency signal; and
    a power amplifier coupled to said second filter.

2. The transmitting circuit of claim 1, wherein said frequency synthesizer is a digital frequency synthesizer.

3. The transmitting circuit of claim 1, wherein said synthesized signals are two signals.

4. The transmitting circuit of claim 1, wherein said first oscillator is a numerical controlled oscillator.

5. The transmitting circuit of claim 1, wherein said first filter is a cascaded integrator-comb filter.

6. The transmitting circuit of claim 1, wherein said second oscillator is a local oscillator.

7. The transmitting circuit of claim 1, wherein said second filter is an analog band-pass filter.

8. The transmitting circuit of claim 1, further comprising a transmitting end coupled to said power amplifier.

9. A non-coherent frequency shift keying transmitting circuit for up-converting a baseband signal to a radio frequency signal, comprising:
    a micro processing unit, receiving said baseband signal and generating a digital signal sequence corresponding to said baseband signal;
    an intermediate frequency processor, coupled to said micro processing unit, up-converting said digital signal sequence to an intermediate frequency signal; and
    a radio frequency processor, coupled to said intermediate frequency processor, up-converting said intermediate frequency signal to a radio frequency signal;
    wherein said intermediate frequency processor comprises a frequency synthesizer using interpolation and a linear feedback shift register, coupled to said micro processing unit, synthesizing said digital signal sequence to a plurality of synthesized signals.

10. The transmitting circuit of claim 9, wherein said intermediate frequency processor further comprises:
    a first oscillator, coupled to said frequency synthesizer, up-converting said plurality of synthesized signals to an intermediate frequency signal;
    a first filter, coupled to said first oscillator, removing a noise of said intermediate frequency signal; and
    a digital-analog converter coupled to said first filter.

11. The transmitting circuit of claim 10, wherein said frequency synthesizer is a digital frequency synthesizer.

12. The transmitting circuit of claim 10, wherein said synthesized signals are two signals.

13. The transmitting circuit of claim 10, wherein said first oscillator is a numerical controlled oscillator.

14. The transmitting circuit of claim 10, wherein said first filter is a cascaded integrator-comb filter.

15. The transmitting circuit of claim 9, wherein said radio frequency processor further comprises:
    a second oscillator, coupled to said digital-analog converter, for up-converting to a radio frequency signal;
    a second filter, coupled to said second oscillator, for removing a noise of said radio frequency signal; and
    a power amplifier, coupled to said second filter.

16. The transmitting circuit of claim 15, wherein said second oscillator is a local oscillator.

17. The transmitting circuit of claim 15, wherein said second filter is an analog band-pass filter.

18. The transmitting circuit of claim 15, further comprising a transmitting end coupled to said power amplifier.

19. A method of non-coherent frequency shift keying transmission, for up-converting a baseband signal to a radio frequency signal, comprising:
    receiving said baseband signal and generating a digital signal sequence corresponding to said baseband signal;
    using interpolation and a linear feedback shift register to synthesize said digital signal sequence to a plurality of synthesized signals;

up-converting said plurality of synthesized signals to an intermediate frequency signal with a first oscillating method;

removing a noise of said intermediate frequency signal with a first filtering method;

converting said noise-removed intermediate frequency signal to an analog signal;

up-converting said analog signal to the radio frequency signal with a second oscillating method;

removing a noise of said radio frequency signal with a second filtering method; and amplifying said noise-removed radio frequency signal and transmitting said amplified radio frequency signal.

20. The method of claim 19, wherein said step of synthesizing said digital signal sequence to synthesized signals is performed by a digital frequency synthesizing method.

21. The method of claim 19, wherein said first oscillating method is a numerical controlled oscillating method.

22. The method of claim 19, wherein said first filtering is a cascaded integrator-comb filtering method.

23. The method of claim 19, wherein said second oscillating method is a local oscillating method.

24. The method of claim 19, wherein said second filtering method is an analog band-pass filtering method.

* * * * *